(12) United States Patent
Shinohara

(10) Patent No.: US 7,629,917 B2
(45) Date of Patent: Dec. 8, 2009

(54) INTEGRATOR AND CYCLIC AD CONVERTER USING THE SAME

(75) Inventor: Yoshiaki Shinohara, Yokohama (JP)

(73) Assignee: Digian Technology, Inc., Yokohama (JP)

( * ) Notice: Subject to any disclaimer, the term of this patent is extended or adjusted under 35 U.S.C. 154(b) by 422 days.

(21) Appl. No.: 11/279,089

(22) Filed: Apr. 7, 2006

(65) Prior Publication Data

US 2007/0001893 A1    Jan. 4, 2007

(30) Foreign Application Priority Data

Apr. 18, 2005    (JP) ............................. 2005-119413

(51) Int. Cl.
*H03M 1/12*    (2006.01)
(52) U.S. Cl. .................. 341/172; 341/118; 341/120; 341/143; 341/155; 341/161
(58) Field of Classification Search ............ 341/118, 341/120, 143, 155, 161, 172
See application file for complete search history.

(56) References Cited

U.S. PATENT DOCUMENTS

| | | | | |
|---|---|---|---|---|
| 5,287,106 A * | 2/1994 | Senderowicz et al. | ....... | 341/118 |
| 5,689,206 A * | 11/1997 | Schaller | ....... | 327/337 |
| 5,818,377 A * | 10/1998 | Wieser | ....... | 341/144 |
| 6,061,009 A * | 5/2000 | Krone et al. | ....... | 341/143 |
| 6,191,715 B1 * | 2/2001 | Fowers | ....... | 341/120 |
| 6,253,311 B1 * | 6/2001 | Elliott et al. | ....... | 712/222 |
| 6,362,761 B1 * | 3/2002 | Bonardi et al. | ....... | 341/143 |
| 6,617,993 B1 * | 9/2003 | Azadet | ....... | 341/169 |
| 6,653,967 B2 * | 11/2003 | Hamashita | ....... | 341/172 |
| 6,753,801 B2 * | 6/2004 | Rossi | ....... | 341/161 |
| 6,943,721 B1 * | 9/2005 | Aswell et al. | ....... | 341/172 |
| 6,956,515 B2 * | 10/2005 | Keehr et al. | ....... | 341/150 |
| 7,088,273 B1 * | 8/2006 | Perdoor et al. | ....... | 341/120 |

* cited by examiner

*Primary Examiner*—Linh V Nguyen
(74) *Attorney, Agent, or Firm*—patenttm.us

(57) ABSTRACT

The present invention provides a cyclic AD converter that reduces power consumption by reducing active circuits such as an X2 amplifier or the like and is particularly suitable to implement in an integrated circuit and also an integrator to be used therefor. The cyclic AD converter uses an integrator 11 comprising an operational amplifier 111, a first integration capacitor C1 connected between the input and output terminals of the operational amplifier 111, and a second integration capacitor C2 to be connected selectively between the reference potential source and the input/output terminals of the operational amplifier 111 by way of switches S3 and S4. The integrator 11 operates to sample/hold an analog input signal and also obtain a signal equal to the double of a reference signal from a comparator. As a result, an X2 amplifier required in the conventional converter is replaced by integration capacitors and switches, thereby reducing power consumption and easily implementing into a semiconductor integrated circuit.

11 Claims, 4 Drawing Sheets

INTEGRATOR AND CYCLIC AD CONVERTER USING THE SAME

FIELD OF THE INVENTION

The present invention relates to an AD converter, more specifically to a cyclic AD converter suitable for converting a relatively low frequency analog signal into a corresponding high-bit digital signal and an integrator to be used therefor.

BACKGROUND OF THE INVENTION

An analog-to-digital (AD) converter is one of key digital circuit devices for converting an analog signal into a corresponding digital signal. Some AD conversion techniques are proposed and put into practical use as ones suitable for converting a relatively low frequency analog signal such as an audio signal into a, for example 10 bits or higher bit (or high resolution) digital signal. Typical AD conversion techniques include a sequential comparison type AD converter and a cyclic AD converter.

FIG. 5 is a block diagram illustrating a basic construction of a typical sequential comparison type AD converter. The m-bits sequential comparison type AD converter 30 comprises a sample/hold circuit 31, a comparator 32, a control logic 33 and a digital-to-analog converter (referred to as a DAC below) 34. An analog input signal to be digitized is inputted to the sample/hold circuit 31. An output from the sample/hold circuit 31 is inputted to the inverting (or –) input terminal of the comparator 32 by way of a resistor 35 and a reference value (for example, a ground potential) is inputted to the non-inverting (or +) input terminal of the comparator 32. An output signal from the comparator 32 is inputted to the control logic 33 to be converted into an m-bits digital output signal that is also inputted to the m-bits DAC 34. An analog signal outputted from the DAC 34 is inputted (or fed back) to the inverting input terminal of the comparator 32.

Now, briefly describing the operation of the sequential comparison type AD converter 30 as shown in FIG. 5, the sample/hold circuit 31 samples and holds instantaneous values of the analog input signal under control of the sample/hold signal that is supplied thereto. The analog signal that is sampled and held by the sample/hold circuit 31 is inputted to the comparator 32 to which an analog voltage corresponding to the most significant bit (MSB, or the $m^{th}$ bit in this particular example) from the control logic 33 is firstly applied, thereby obtaining a difference signal between the output from the DAC 34 and the sampled analog voltage from the sample/hold circuit 31. The comparator 32 makes a judgment whether the difference signal is positive or negative. The control logic 33 operates based on a clock signal applied thereto and determines "1" or "0" as the output for the $m^{th}$ bit depending on positive or negative output of the comparator 32. Thereafter, similar operations are sequentially repeated to make a judgment of "1" or "0" for the $(m-1)^{th}$ bit, . . . , the $2^{nd}$ bit and finally the least significant bit (i.e., LSB or the IST bit). Upon completing judgments for all bits from the MSB to the LSB, the control logic 33 outputs the digitized (or AD converted digital) value before the sample/hold circuit 31 acquires subsequent samples of the analog input signal at subsequent instances. Repetition of the aforementioned AD conversion operation results in AD conversion of the sequentially inputted analog signal. In such sequential comparison type AD converter 30, the DAC 34 is essential and such DAC 34 generally employs R-2R ladder circuits (i.e., current distribution type ladder circuits) or C-2C charge distribution type ladder circuits. However, such ladder circuits must be extremely precise and occupy a very large area on a substrate when implementing in a semiconductor integrated circuit (IC), thereby making it very difficult to implement in an IC or miniaturize.

A cyclic AD converter is proposed in order to overcome such disadvantages and is disclosed in some publications including the following non-patent document: Chen-Chung Shin, et. al., "Reference Refreshing Cyclic Analog-to-Digital and Digital-to-Analog Converters", IEEE Journal of Solid-State Circuits, Vol. SC-21, No. 4, August 1986, pp 544-554.

FIG. 6 is a block diagram illustrating a basic construction of a conventional cyclic AD converter 40. The cyclic AD converter 40 comprises a sample/hold circuit 41, a comparator 42, a control logic 43, a reference value switching circuit 44, an adder 45, an X2 amplifier (i.e., amplifier having the amplification factor of 2) 46 and an input switch 47. The cyclic AD converter 40 is essentially replacing the DAC 34 of the sequential comparison type AD converter 30 as illustrated in FIG. 5 by the X2 amplifier 46 and the reference value switching circuit 44.

In the cyclic AD converter 40, an analog signal to be digitized is inputted to the sample/hold circuit 41 by way of the switch 47 that operates under control of a sample/hold signal. An output from the sample/hold circuit 41 is inputted to the inverting input terminal of the comparator 42 having the non-inverting input terminal to which a threshold value (a reference value) is applied and also to the non-inverting input terminal of the adder 45. A comparison output from the comparator 42 is inputted to the control logic 43 that operates under control of a clock. The control logic 43 outputs a digitized output and a control signal for controlling the reference value switching circuit 44. An output form the reference switching circuit 44 is inputted to the inverting input terminal of the adder 45. And an output signal from the adder 45 is amplified by the factor of 2 by the X2 amplifier 46 and inputted to the sample/hold circuit 41 by way of the switch 47.

Now, the operation of the cyclic AD converter 40 will be briefly described hereunder. Firstly, the switch 47 is controlled to apply an analog input signal to the sample/hold circuit 41 that is designed to sample/hold instantaneous values (samples) of the analog input signal. The comparator 42 compares each sample with the threshold value and a comparison result that is either "H (or high level)" or "L (or low level)" is inputted to the control logic 43. It is to be noted here that the control logic 43 controls the switch in the reference value switching circuit 44 so that a reference value Vref or a ground potential is inputted to the adder 45 when the comparison result of the comparator 42 is H or L, respectively. Also, the control logic 43 sets the $m^{th}$ bit (or the MSB) to "1" or "0" when the comparison result of the comparator 42 is H or L, respectively. Then, an output from the adder 45 representing a difference signal of the sample value from the sample/hold circuit 41 and the reference voltage or ground potential that depends on the comparison result of the comparator 42 is amplified by the factor of 2 by the X2 amplifier 46 before being inputted to the sample/hold circuit 41 by way of the switch 47. Similarly, the above operation to make a judgment of the digital value "1" or "0" for the $(m-1)^{th}$ and the subsequent bits will be repeated until the digital value for the LSB is determined and outputted from the control logic 43.

As apparent from the above description, since the cyclic AD converter 40 as described hereinabove requires no DAC unlike the sequential comparison type AD converter 30, no large circuit area is required for implementing the circuit in, for example, an IC and thus enabling to miniaturize the circuit. However, since the adder 45 and the X2 amplifier 46 are generally implemented using active devices, there is a drawback to consume relatively large power as compared to non-active (i.e., passive) devices. In particular, low power consumption is essential to portable audio equipment, hearing aids and the like that are driven by a built-in battery because an operation time by a fully charged battery is one of key factors of such electronic appliances. In other words, reducing power consumption of an AD converter is a very important technical feature to enhance competitiveness of such electronic appliances in the marketplace.

SUMMARY OF THE INVENTION

In light of the aforementioned problems of the prior art, it is an object of the present invention to provide a cyclic AD converter to solve such problems. It is another object of the present invention to provide a cyclic AD converter suitable for implementing in an IC device and an integrator to be used therefor.

An integrator according to the present invention includes an amplifier having the non-inverting input terminal connected to a reference potential source and the inverting input terminal, and a first integration capacitor connected between the inverting input terminal and the output terminal of the amplifier, characterized in the provision of a second integration capacitor selectively connected between the reference potential source and the output terminal or the inverting input terminal of the amplifier. According to preferred embodiments of the present invention, the first and second integration capacitors have essentially equal capacitance to each other. The second integration capacitor is connected between the output terminal and the reference potential source during the integration operation of the first integration capacitor for storing essentially the same amount of charge as the first integration capacitor. The second integration capacitor is connected between the inverting input terminal of the amplifier and the reference potential source for transferring the charge in the second integration capacitor to the first integration capacitor. The selective connection of the second integration capacitor is made using electronic switches. All of the constituent elements are integrated into a semiconductor integrated circuit.

A cyclic AD converter according to the present invention is a type to compare an output of an integrator to sample/hold an input signal with a threshold value using a comparator, determine the digital value for one bit based on the comparison result using a control logic, obtain a difference signal by subtracting different reference values from the output of the integrator, and determine digital values for the subsequent bits by repetitively comparing the double of the difference signal with the threshold value using the comparator, characterized in employing the abovementioned integrator as the integrator. According to a preferred embodiment of the present invention, the integrator, the comparator and the control logic are integrated into a semiconductor integrated circuit.

Another cyclic AD converter according to the present invention is a type to sample/hold an instantaneous value of an analog input signal, determine the digital value for a bit based on a comparison result with a threshold value using a comparator and obtain a value equal to the double of a reference signal from a reference value based on the comparison result, and convert into a plural bits digital signal by determining digital values for sequentially lower bits, characterized in obtaining the double of the difference signal using adding means for adding an equal difference signal to the difference signal. According to preferred embodiments of the present invention, the adding means is integrated into the integrator. The adding means comprises an additional capacitor to be connected selectively between the reference potential source and the input/output terminals of the integrator by way of switches. The additional capacitor has the equal capacitance to that of the integration capacitor connected between the input and output terminals of an amplifier that constitutes the integrator. All of the constituent elements including the additional capacitor, the integration capacitor and the switches are integrated into a semiconductor integrated circuit.

The integrator and the cyclic AD converter according to the present invention exhibit the following practical advantages. That is, since the integrator comprises not only the first integration capacitor connected between the input/output terminals of the amplifier (or an operational amplifier) but also the second integration capacitor to be connected selectively between the reference potential source and the input/output terminals of the amplifier, it is possible to transfer the charge stored in the second integration capacitor to the first integration capacitor for adding the charge in the both integration capacitors or obtaining the output equal to the double of the first integration capacitor. By applying the integrator to the cyclic AD converter, it is possible to implement the AD converter using passive devices such as capacitors, switching devices and the like without the need for the DAC requiring a large area or the power consuming X2 amplifier and/or adder that are essential in the conventional converter, thereby significantly reducing power consumption and achieving miniaturization that are particularly preferable for compact, lightweight electronic appliances such as hearing aids or the like driven by a built-in battery.

BRIEF DESCRIPTION OF THE DRAWINGS

In the accompanying drawings.

EMBODIMENTS OF THE PRESENT INVENTION

Now, both construction and operation of preferred embodiments of the cyclic AD converter and the integrator to be used therefor according to the present invention will be described hereunder with reference to the accompanying drawings.

Figure 1:
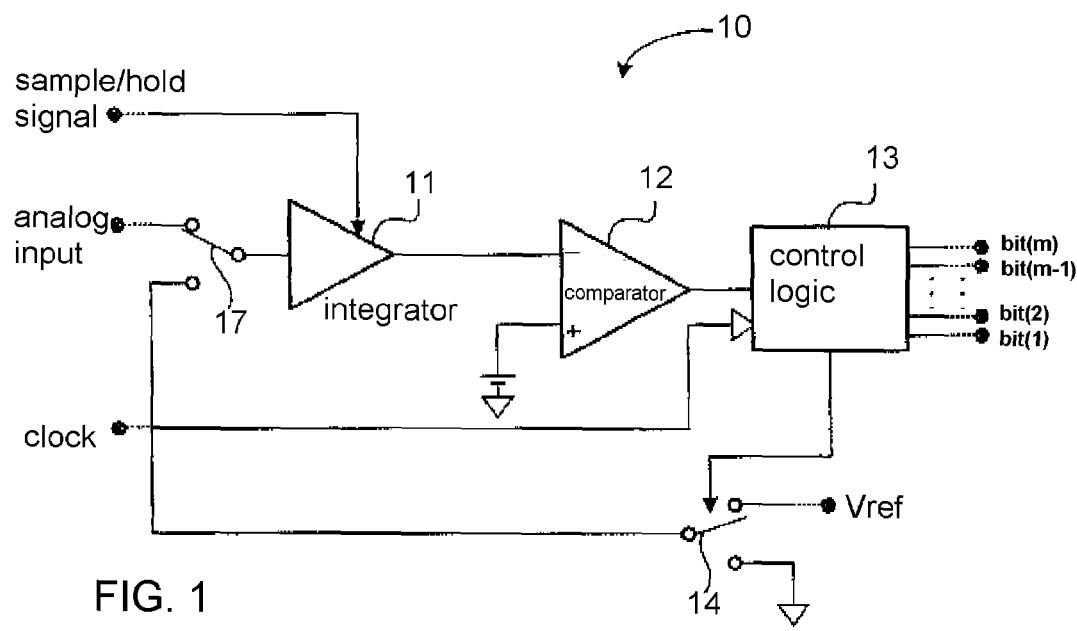
FIG. 1 is a block diagram illustrating a basic construction of a cyclic AD converter according to the present invention.

Firstly, FIG. 1 is a block diagram illustrating the entire construction of a preferred embodiment of the cyclic AD converter according to the present invention. The cyclic AD converter 10 comprises an integrator 11 performing a sample/hold function, a comparator 12, a control logic 13, a reference value switching circuit 14 and an input switch 17.

Either an analog input signal to be digitized or a reference value from the reference value switching circuit 14 is inputted to the input terminal of the integrator 11 by way of the input switch 17. A sample/hold signal is also inputted to the integrator 11 for controlling the sample/hold operation. An output signal of the integrator 11 is inputted to the inverting (or −) input terminal of the comparator 12 having the non-inverting (or +) input terminal to which a reference voltage is applied. A comparison output from the comparator 12 is inputted to the control logic 13 that operates under control of a clock signal. The control logic 13 outputs m (plural)-bits of digital signal and a control signal to be applied to the reference value switching circuit 14. An output of the reference value switching circuit 14 is inputted to the input switch 17 as described hereinabove.

Figures 2A, 2B:
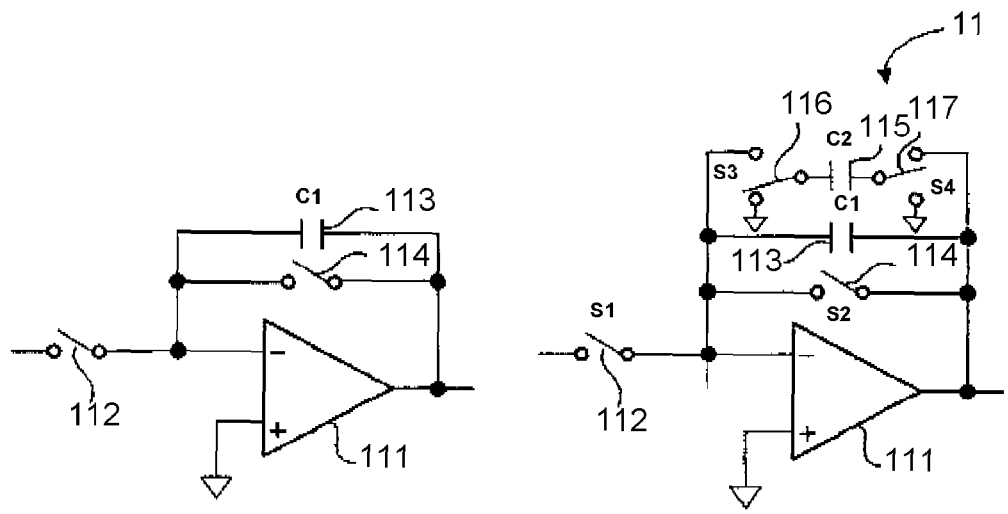
FIG. 2 shows integrators to be used for a cyclic AD converter, wherein (A) is a typical integrator, while (B) is an integrator according to the present invention.

Now, FIG. 2 shows constructions of integrators. FIG. 2(A) is the construction of a typical conventional integrator, while FIG. 2(B) is the construction of the integrator according to the present invention that is suitably used as the integrator 11 for the cyclic AD converter 10 according to the present invention illustrated in FIG. 1.

The integrator as shown in FIG. 2(A) comprises an operational amplifier 111 having the inverting (−) input terminal, the non-inverting (+) input terminal and the output terminal, an input switch (a first switch) 112 selectively applying an input signal to the inverting input terminal of the operational amplifier 111, a capacitor (C1) 113 connected between the inverting input terminal and the output terminal of the operational amplifier 111 and a discharging switch (a second switch) 114 connected across the capacitor 113. And a reference potential source (a ground potential) is applied to the non-inverting input terminal of the operational amplifier 111.

Firstly, a sample/hold operation using the typical integrator as shown in FIG. 2(A) will be described. Initially, the second switch 114 is closed to shunt the capacitor (an integration capacitor C1) 113 for initializing by discharging any charge stored therein. Then, the input signal is inputted to the inverting input terminal of the operational amplifier 111 by opening the second switch 114 and closing the first switch 112. Since the gain (or the amplification factor) of the operational amplifier 111 is so high that the potential on the inverting input terminal remains essentially the reference (ground) potential as applied to the non-inverting input terminal of the operational amplifier 111, thereby allowing the capacitor C1 to be charged to the same voltage as the input voltage at the instance of closing the first switch 112 (i.e., the sample voltage) and output such voltage from the output terminal of the operational amplifier 111. It is to be noted that by opening the first switch 112 the sample voltage is held in the capacitor 113 until discharging the charge therein by closing the second switch 114.

The same operation as described hereinabove is repeated for acquiring subsequent samples. That is, the second switch 114 is closed to discharge the charge in the capacitor 113. The capacitor 113 is, then, charged to the instantaneous voltage of the input signal by opening the second switch 114 and closing the first switch 112. Then, the capacitor 113 holds the subsequent sample voltage by opening the first switch 112. In this manner, the input signal voltage is sequentially sampled in accordance with closing and opening the switches 112 and 114.

Now, the construction of the integrator 11 according to the present invention that is suitably used for the cyclic AD converter 10 according to the present invention will be described with reference to FIG. 2(B). It is to be noted that for convenience of description like reference numerals are used to refer to the constituting elements corresponding to those in the integrator in FIG. 2(A). The integrator 11 comprises an operational amplifier 111, a first switch (S1) 112, connected in series with the inverting input terminal of the operational amplifier 111, a capacitor (a first integration capacitor C1) 113 connected between the inverting input terminal and the output terminal of the operational amplifier 111, a second switch (S2) 114 connected across the capacitor 113, a third switch (a single pole, double throw switch S3) 116 provided at the input side of the operational amplifier 111, a fourth switch (a single pole, double throw switch S4) 117 provided at the output side of the operational amplifier 111, and a capacitor (a second integration capacitor C2) 115 disposed between the third switch 116 and the fourth switch 117. The capacitor 115 is connected between the movable contacts of the third switch 116 and the fourth switch 117. The third switch 116 has a pair of fixed contacts one of which is connected to the inverting input terminal of the operational amplifier 111 and the other of which is returned to ground. Similarly, the fourth switch 117 has a pair of fixed contacts one of which is connected to the output terminal of the operational amplifier 111 and the other of which is returned to ground. It is to be noted herein that the first integration capacitor (C1) 113 and the second integration capacitor (C2) 115 have an equal capacitance to each other.

Now, the sample/hold operation of the integrator 11 as shown in FIG. 2(B) will be described. Firstly, the second switch 114 is closed to discharge any charge stored therein for initialization. Then, the first switch 112 is closed after opening the second switch 114. Similarly to the operation as described hereinabove with reference to FIG. 2(A), the input signal voltage at the instance (the instantaneous voltage is referred to as "e1" below) is sampled for charging the first integration capacitor 113 to the voltage e1. As appreciated by a person having an ordinary skill in the art, the input signal voltage is applied to the operational amplifier 111 by way of a low resistance (Ro) including an ON (or conducting) resistance of the first switch 112. The capacitance (C1) of the first integration capacitor 113 is also small, thereby setting the time constant that is equal to the product of Ro and C1 (i.e., Ro×C2) sufficiently small with respect to the frequency of the input signal to be digitized.

During the abovementioned sampling of the input signal voltage e1, the movable contacts of the third switch 116 and the fourth switch 117 are set in the shown positions, i.e., the second integration capacitor 115 is connected between the output terminal of the operational amplifier 111 and ground. Accordingly, the second integration capacitor 115 is charged to the same voltage e1 as the first integration capacitor 113. It is to be noted at this instance that, by switching the movable contacts of the third switch 116 and the fourth switch 117 to the opposite positions to those as shown in FIG. 2(B), i.e., connecting the fourth switch 117 to ground and connecting the third switch 116 to the inverting input terminal of the operational amplifier 111, the charge stored in the second integration capacitor 115 is transferred to the first integration capacitor 113. After transfer of the charge in the second integration capacitor 115 to the first integration capacitor 113, the charge in the second integration capacitor 115 is completely discharged or depleted.

After discharging the charge in the first integration capacitor 113 and the second integration capacitor 115, the second switch 114, the third switch 116 and the fourth switch 117 are returned to the initial condition. The first switch 112 is closed for sampling the input signal voltage at that instance (e2), thereby charging the first integration capacitor 113 and the second integration capacitor 115 to the sampled voltage e2. Subsequently, the operation will be repeated for performing sample/hold sequential sampling voltages e3, e4, e5, etc. in the first integration capacitor 113 and the second integration capacitor 115 at the instances when the first switch 112 is closed.

The sample voltages e held in the first integration capacitor 113 and the second integration capacitor 115 as a result of the abovementioned sample/hold operation are used as adding means in the cyclic AD converter according to the present invention that will be described hereinafter. That is, since an equal sample voltage e is held in the first integration capacitor 113 and the second integration capacitor 115, such charges are effectively utilized to obtain the charge equal to the sum of the charges or doubling the charge in the capacitor 113. Firstly, the charge stored in the first integration capacitor 113 is outputted (for example to the capacitor disposed at the output side of the integrator). Then, by switching the movable contacts of the third switch 116 and the fourth switch 117 to the opposite positions to those as shown in FIG. 2(B), the charge in the second integration capacitor 115 is transferred to the first integration capacitor 113 and is outputted.

Figure 3:
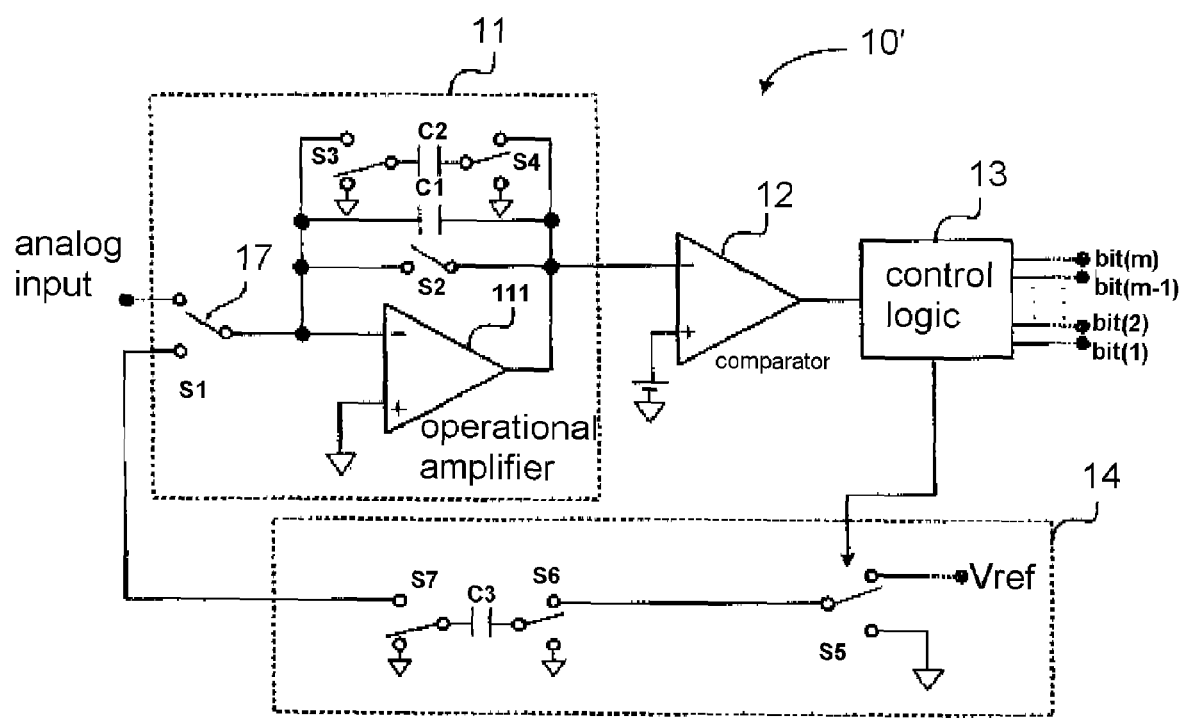
FIG. 3 is a block diagram for describing the operation of the cyclic AD converter according to the present invention.

Now, the operation of the cyclic AD converter 10 as shown in FIG. 1 will be described with reference to FIG. 3. FIG. 3 is a block diagram illustrating a specific construction of the cyclic AD converter 10' according to the present invention whose principle construction is shown in FIG. 1. For convenience of description, like reference numerals are used for constituent elements corresponding to those in FIG. 1.

The cyclic AD converter 10' as shown in FIG. 3 has basically the same construction as the cyclic AD converter 10 as shown in FIG. 1 and comprises an integrator 11, a comparator 12, a control logic 13 and a reference value switching circuit 14. And the integrator 11 includes an operational amplifier 111, a first integration capacitor C1, a second integration capacitor C2, a first switch S1 connected to the input side of the operational amplifier 111, a second switch S2 connected across the first integration capacitor C1, a third switch S3 having a movable contact connected to one end of the second integration capacitor C2 and a pair of fixed contacts connected to the inverting input terminal of the operational amplifier 111 and the reference potential source, and a fourth switch S4 having a movable contact connected to the other end of the second integration capacitor C2 and a pair of fixed contacts connected to the output terminal of the operational amplifier 111 and the reference potential source.

The reference value switching circuit 14 includes a fifth switch S5, a sixth switch S6 and a seventh switch S7 all of which are single pole, double throw switches and a capacitor C3. The fifth switch S5 switches and selects either the reference value Vref or ground potential connected to its fixed contacts. The sixth switch S6 has a pair of fixed contacts connected to the movable contact of the fifth switch S5 and ground potential and a movable contact connected to one end of the third capacitor C3. The seventh switch S7 has a movable contact connected to the other end of the third capacitor C3 and a pair of fixed contacts connected to one fixed contact of the first switch S1 and ground potential. And the other fixed contact of the first switch S1 is connected to the analog input signal to be digitized and its movable contact is connected to the inverting input terminal of the operational amplifier 111.

It is to be noted that all of the constituent elements of the cyclic AD converter 10' are preferably integrated in a single device (or an IC). In this case, the switches S1-S7 are preferably electronic switches such as field effect transistors (FETs). Also, the integration capacitors C1-C3 can be implemented in an IC device by forming electrodes having a given area on an IC chip so that capacitances of all of the capacitors C1-C3 are precisely equal to one another. In this manner, the cyclic AD converter 10' can be constructed in a miniature design and at a low cost.

The cyclic AD converter 10' as shown in FIG. 3 is initialized by first closing the second switch S2 for discharging the first integration capacitor C1. Then, the first switch S1, the thirds switch S3 and the fourth switch S4 are set to the positions as shown in FIG. 3 for charging the first integration capacitor C1 and the second integration capacitor C2 to a sample voltage e1 that is the instantaneous voltage of the analog input signal by way of the first switch S1. The sample voltage e1 is compared with the reference value (or a threshold value) set to the non-inverting input terminal of the comparator 12. A comparison result of the comparator 12 is inputted to the control logic 13.

The control logic 13 controls the fifth switch S5—the seventh switch S7 in accordance with the comparison result of the comparator 12, sets these switches S5-S7 to the positions as shown in FIG. 3 for charging the third capacitor C3 to Vref and sets the MSB (or the $m^{th}$ bit) to "1" if the sample voltage e1 is larger than the threshold value. Then, the first switch S1, the sixth switch S6 and the seventh switch S7 are switched to the opposite positions to those as shown in FIG. 3 for removing (or subtracting) the charge in the third capacitor C3 from that in the first integration capacitor C1. On the other hand, if the sample voltage e1 is lower than the threshold value, the control logic 13 switches the fifth switch S5 to the ground potential from the position as shown in FIG. 3. Accordingly, no charge is stored in the third capacitor C3, thereby removing no charge from the first integration capacitor C1.

Then, the third switch S3 and the fourth switch S4 are switched from the positions as shown in FIG. 3 to the opposite positions in order to transfer the charge in the second capacitor C2 to the first integration capacitor C1. As a result, the charge in the first integration capacitor C1 is doubled by adding the same amount of charge. The charge in the first integration capacitor C1 is then compared by the comparator 12 with the threshold value. Based on the comparison result, the control logic 13 makes a judgment whether the next significant bit (i.e., $(m-1)^{th}$ bit) is "1" or "0". Similarly, the above operation is repeated until reaching the LSB, thereby completing the digitizing procedure for the sample voltage e1 and outputting the corresponding digital signal from the control logic 13.

Upon completing the digitizing procedure for up to m-bits of the sample voltage e1, the second switch S2 is closed for discharging any charge in the first integration capacitor C1. The first switch S1 is, then, switched to the position as shown in FIG. 3 in order to sample/hold the next (or the second) sample voltage e2. The second sample voltage e2 is digitized from the MSB to the LSB in the same manner as described hereinabove for the first sample voltage e1. The same operation is repeated by performing sample/hold of the subsequent sample voltages e3, e4, e5, etc.

Figure 4:
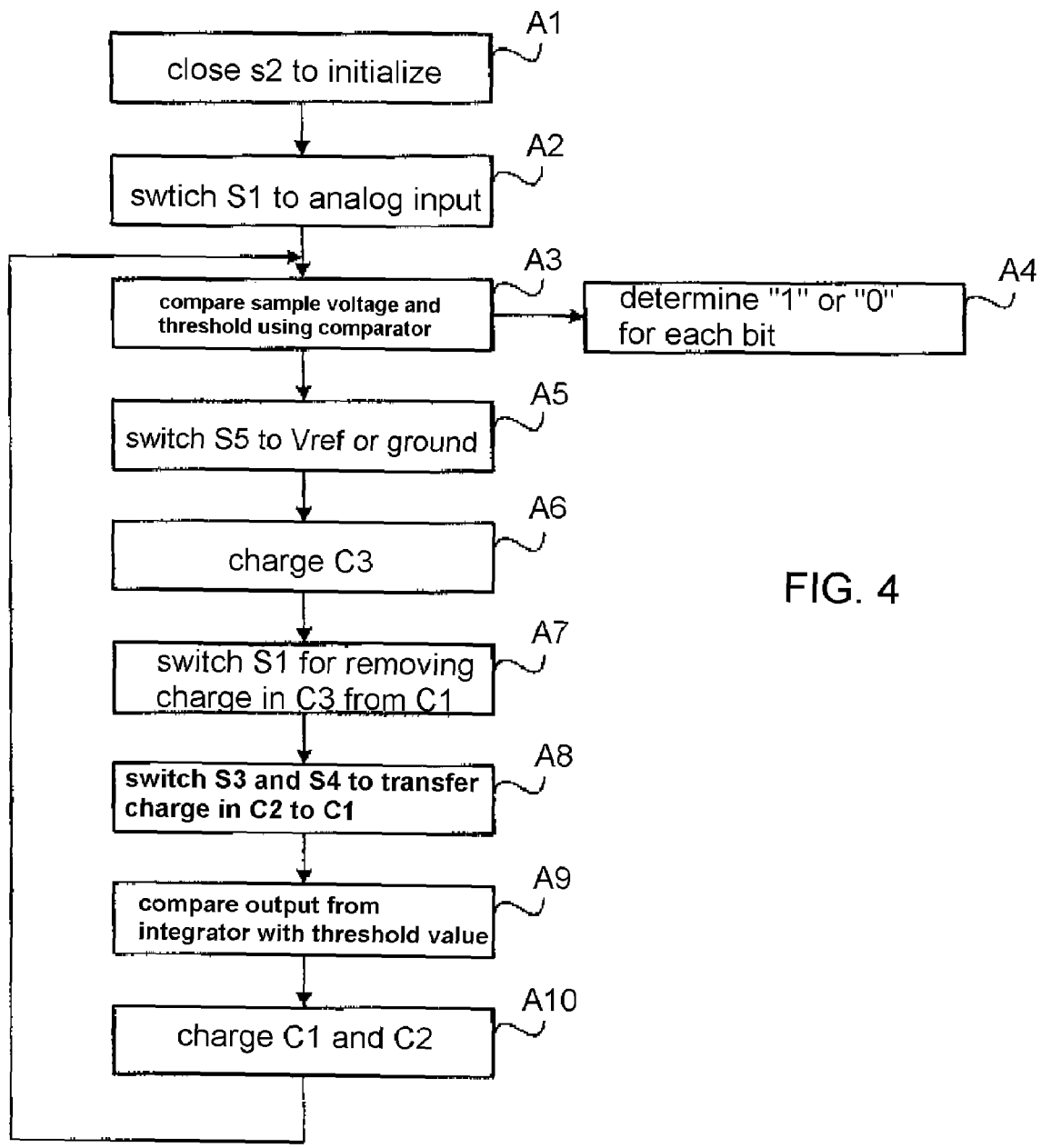
FIG. 4 is a flowchart for describing the operation of the cyclic AD converter as shown in FIG. 3.
Figure 5:
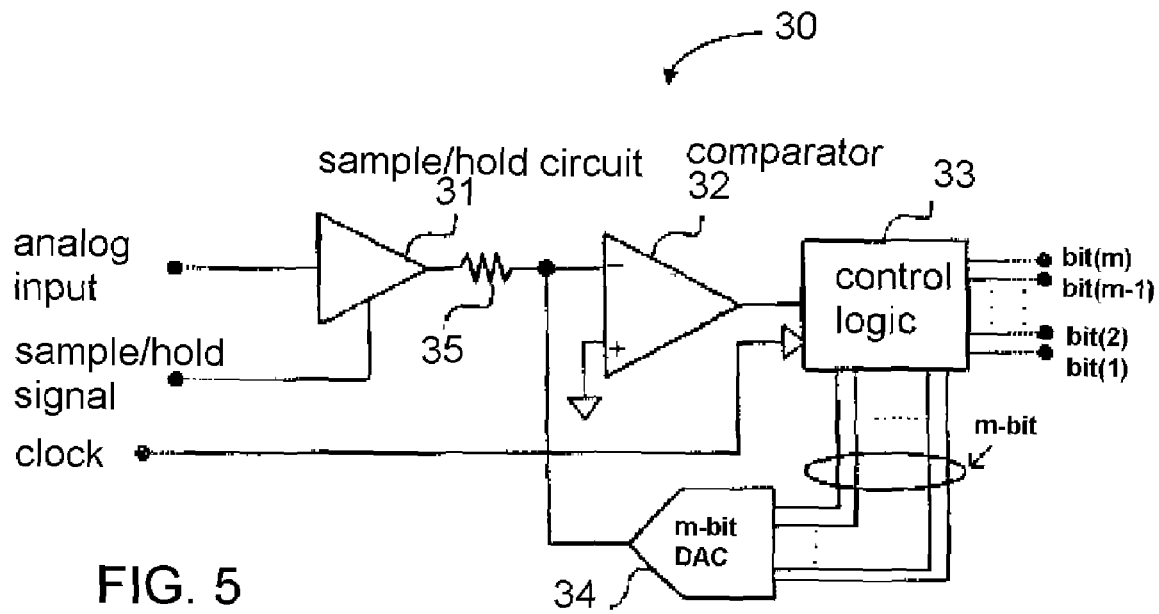
FIG. 5 is a block diagram of a conventional sequential comparison type AD converter.
Figure 6:
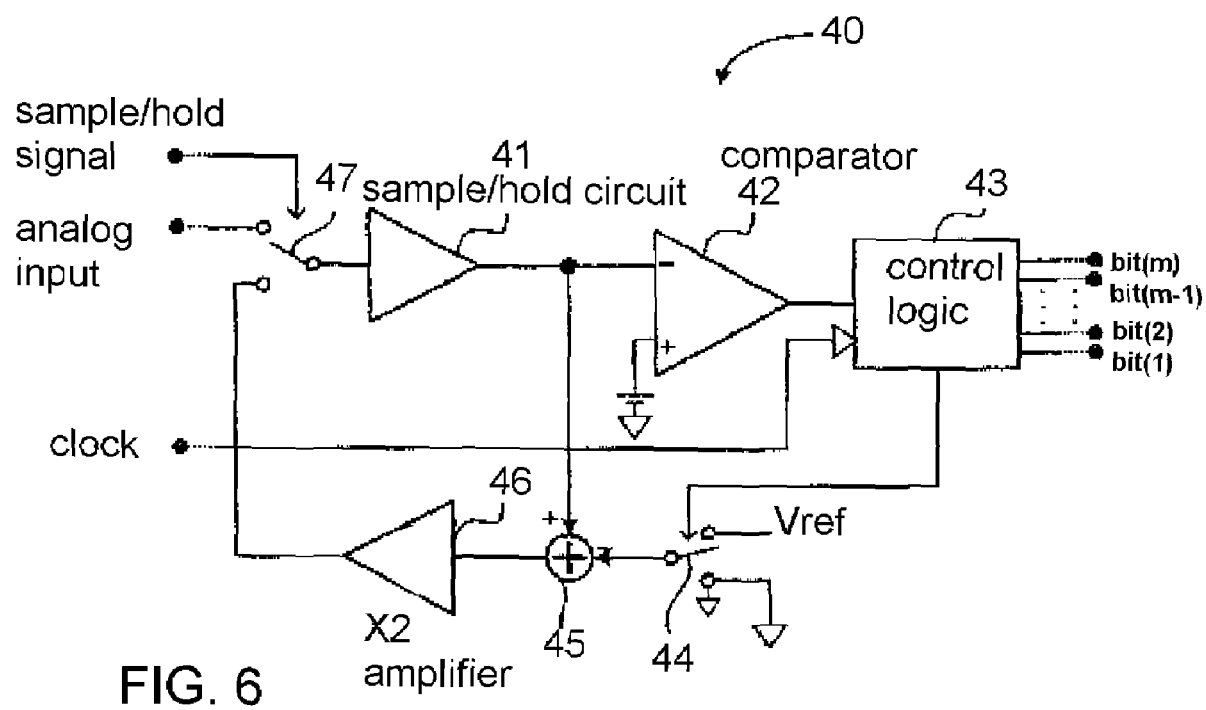
FIG. 6 is a block diagram of a conventional cyclic AD converter.

Now, the operation of the abovementioned cyclic AD converter 10' according to the present invention will be described in detail with reference to FIG. 4 that illustrates a flowchart of the cyclic AD converter 10'. Firstly, the switch S2 is closed for initialization by discharging any charge in the first integration capacitor C1 (step A1). Then, the switch S1 is switched to the analog input signal for inputting such analog input signal to the operational amplifier 111 (step A2). It is to be noted in this instance that the switches S3 and S4 are in the positions as shown in FIG. 3 and the second integration capacitor C2 is connected between the output terminal of the operational amplifier 111 and ground.

The comparator 12 compares the output signal from the integrator 11 with the threshold value (step A3). And the comparison output of the comparator 12 is outputted to the control logic 13 to determine the MSB value (step A4) and switches the switch S5 in the reference value switching circuit 14 to either Vref or ground potential (step A5). That is, Vref is selected if the input to the comparator 12 is larger than Vref, while selecting ground potential if the input is lower than the threshold value. The third capacitor C3 is charged depending on the reference value selected by the switch S5 (step A6). It is to be noted at this time that the switches S6 and S7 are in the positions as shown in FIG. 3, i.e., the third capacitor C3 is connected between the reference value (Vref or ground potential) and ground.

The switch S1 is, then, connected to the reference value switching circuit 14 side (and the switch S7 is switched to the opposite position to that as shown in FIG. 3) for connecting the capacitor C3 between the switch S1 and ground, thereby removing (or subtracting) the charge in the third capacitor C3 from the first integration capacitor C1 (step A7). Then, the switches S3 and S4 are switched for connecting the second integration capacitor C2 to the inverting input terminal of the operational amplifier 111 for transferring the charge in the second integration capacitor C2 to the first integration capacitor C1 (step A8). This results in doubling the charge in the first integration capacitor C1. The comparator 12 compares the output from the integrator 11 with the threshold value (step A9). Simultaneously, the switches S3 and S4 are switched for charging the first capacitor C1 and the second capacitor C2 to an equal value to each other (step A10). Subsequently, the aforementioned steps A3 through A10 are repeated equal to the number of bits of the AD converter for determining values for all bits from the MSB to the LSB.

Upon completing the aforementioned AD conversion procedure for the sample voltage e1 of the analog input signal, the switch S1 is closed to sample/hold the next sample voltage e2. And the similar operations as described hereinabove will be repeated for the desired number of samples or time.

As described hereinabove, the cyclic AD converter according to the present invention is based on the fact that doubling any signal e (i.e., 2e) is equal to addition of the same signal e (i.e., e+e=2e), thereby replacing the X2 amplifier that is required in the conventional AD converter for amplifying the difference signal by the factor of 2 by an adder or summing operation. Additionally, the summing operation is carried out by the integrator that performs the sample/hold operation for adding charges. It is therefore possible to achieve the operation by utilizing passive elements, i.e., capacitors and switches.

The constructions and operations of preferred embodiments of the integrator and the cyclic AD converter using such integrator according to the present invention have been described in greater detail. It is to be noted, however, that such embodiments are nothing but examples of the present invention and not for the purpose of restricting the present invention. Various modifications and alternations of the present invention may be easily made by a person having an ordinary skill in the art without departing from the scope and spirit of the present invention. For example, although a single comparator is used in the shown preferred embodiment, it is possible to use a pair of comparators that compare with a pair of threshold values.

What is claimed is:

1. An integrator including an amplifier having the non-inverting input terminal connected to a reference potential source, an inverting input terminal to be connected to an input signal source and an output terminal and a first integration capacitor connected between the inverting input terminal and the output terminal of the amplifier, comprising:
    a second integration capacitor and switches for connecting first and second terminals of the second integration capacitor respectively to the output terminal of the amplifier and the reference potential source in one time or respectively to the reference potential source and the non-inverting input terminal of the amplifier in another time.

2. An integrator of claim 1, wherein all constituent elements are implemented into an integrated circuit.

3. An integrator of claim 1, further comprising another switch connected in parallel with the first integration capacitor for discharging charges therein when closing the switch.

4. An integrator of claim 1, wherein the first and second integration capacitors have essentially equal capacitance to each other.

5. A cyclic AD converter of the type to compare an output from an integrator to sample/hold an input signal with a threshold value by a comparator, determine the value for one bit by a control logic depending on a comparison result of the comparator, obtain a difference signal by subtracting different reference values from the output of the integrator, and repeatedly compare the double of the difference signal with the reference value by the comparator for determining values for sequential bits,
    characterized in using either one of the integrators in claims 1, 2, 3 or 4 as the integrator.

6. A cyclic AD converter of claim 5, wherein the integrator, the comparator and the control circuit are implemented in an integrated circuit.

7. A cyclic AD converter of the type to sample/hold instantaneous values of an analog input signal using an integrator, compare the each instantaneous value with a threshold value using a comparator to determine a digital value for a bit based on a comparison result of the comparator, obtaining a double of a difference signal from the reference value based on the comparison result, and convert into a digital signal of plural bits by determining digital values of sequentially lower order bits,
    characterized in obtaining the value equal to double of the difference signal by adding means for adding the signal equal to the difference signal.

8. A cyclic AD converter of claim 7, wherein the adding means is integrated into the integrator.

9. A cyclic AD converter of claim 7, wherein the adding means comprises an additional capacitor selectively connected between the input/output terminals of the integrator and the reference potential source by way of a switch.

10. A cyclic AD converter of claim 9, wherein the additional capacitor has an equal capacitance as that of the integration capacitor connected between the input and output terminals of an amplifier constituting the integrator.

11. A cyclic AD converter of claim 7, wherein all constituent elements including the additional capacitor, the integration capacitor and the switch are integrated into a semiconductor integration circuit.

* * * * *